(12) United States Patent
Matano

(10) Patent No.: US 8,509,009 B2
(45) Date of Patent: *Aug. 13, 2013

(54) SEMICONDUCTOR APPARATUS

(75) Inventor: Tatsuya Matano, Tokyo (JP)

(73) Assignee: Rambus Inc., Sunnyvale, CA (US)

( * ) Notice: Subject to any disclaimer, the term of this patent is extended or adjusted under 35 U.S.C. 154(b) by 30 days.

This patent is subject to a terminal disclaimer.

(21) Appl. No.: 13/370,854

(22) Filed: Feb. 10, 2012

(65) Prior Publication Data

US 2012/0139508 A1 Jun. 7, 2012

Related U.S. Application Data

(63) Continuation of application No. 12/654,647, filed on Dec. 28, 2009, now Pat. No. 8,139,424, which is a continuation of application No. 11/518,427, filed on Sep. 11, 2006, now Pat. No. 7,684,261.

(30) Foreign Application Priority Data

Sep. 13, 2005 (JP) .................................. 2005-265346

(51) Int. Cl.
*G11C 5/14* (2006.01)

(52) U.S. Cl.
USPC ...... 365/189.09; 365/194; 365/224; 327/142; 327/143; 327/198; 327/543

(58) Field of Classification Search
USPC ................... 365/189.09, 194, 224; 327/142, 327/143, 198, 543
See application file for complete search history.

(56) References Cited

U.S. PATENT DOCUMENTS 5,459,684 A 10/1995 Nakamura et al.
5,936,443 A 8/1999 Yasuda et al.
5,990,729 A * 11/1999 Kozuka et al. ................. 327/543
6,011,447 A * 1/2000 Iwasaki ......................... 331/185

(Continued)

FOREIGN PATENT DOCUMENTS

| JP | 2002-111466 | 4/2002 |
| JP | 2003-223783 | 8/2003 |
| JP | 2004-152405 | 5/2004 |
| JP | 2004-279052 | 10/2004 |

OTHER PUBLICATIONS

Office Action dated Jul. 20, 2011 (U.S. Appl. No. 12/654,647).
Office Action dated Jun. 4, 2009 (U.S. Appl. No. 11/518,427).

(Continued)

*Primary Examiner* — Toan Le
*Assistant Examiner* — Hai Pham
(74) *Attorney, Agent, or Firm* — Stolowitz Ford Cowger LLP

(57) ABSTRACT

A device includes a first internal voltage generation circuit generating a first internal voltage in response to an external power supply voltage, a second internal voltage generation circuit generating a second internal voltage in response to the external power supply voltage, the second internal voltage being different in voltage level from the first internal voltage, and a preset signal generation circuit responding to a power-on of the external power supply voltage to the device and generating, independently of the first internal voltage, first and second preset signals that bring the first and the second internal voltage generation circuits into respective initial states, the preset signal generating circuit stopping generation of the first preset signal when the external power supply voltage reaches a first voltage level and stopping generation of the second preset signal when the external power supply voltage reaches a second voltage level different from the first voltage level.

20 Claims, 10 Drawing Sheets

(56) References Cited

U.S. PATENT DOCUMENTS

| | | |
|---|---|---|
| 6,163,180 A | 12/2000 | Hidaka et al. |
| 6,492,850 B2 | 12/2002 | Kato et al. |
| 6,686,783 B1 * | 2/2004 | Huang ......................... 327/143 |
| 7,193,907 B2 | 3/2007 | Nakatake et al. |

OTHER PUBLICATIONS

Office Action dated Dec. 15, 2008 (U.S. Appl. No. 11/518,427).
Office Action dated Jul. 11, 2008 (U.S. Appl. No. 11/518,427).

* cited by examiner

SEMICONDUCTOR APPARATUS

The present application is a Continuation Application of U.S. patent application Ser. No. 12/654,647, filed on Dec. 28, 2009, now U.S. Pat. No. 8,139,424 which is a Continuation Application of U.S. patent application Ser. No. 11/518,427 (now U.S. Pat. No. 7,684,261 B2), filed on Sep. 11, 2006, which is based on Japanese patent application No. 2005-265346, filed on Sep. 13, 2005, the entire contents of which are incorporated herein by reference.

BACKGROUND OF THE INVENTION

This invention relates to a semiconductor apparatus and, in particular, to a semiconductor apparatus having a preset signal generating circuit for producing a preset signal for use in setting an initial operation of an internal circuit at power on.

Recently, a semiconductor apparatus is developed towards larger-scale integration and higher-speed operation and semiconductor devices used therein are developed towards miniaturization. Following the miniaturization of the semiconductor devices, a power supply voltage of the semiconductor apparatus is lowered. As the power supply voltage is lowered, it is required that each internal circuit of the semiconductor apparatus is supplied with an optimum power supply voltage to perform an optimum operation. By such optimization, large-scale integration and high-speed operation are achieved. For this purpose, the semiconductor apparatus contains an internal power supply voltage generating circuit for generating power supply voltages for various internal circuits. The internal power supply voltage generating circuit generates various internal power supply voltages by stepping up or down an external power supply voltage supplied from the outside.

In the above-mentioned semiconductor apparatus, at power on, an internal circuit preset signal is generated to control rising of a power supply voltage of each of the internal power supply voltage generating circuit and peripheral control circuits supplied with the internal power supply voltages generated by the internal power supply voltage generating circuit. Referring to FIG. 1, the semiconductor apparatus comprises a preset signal (PRESET) generating circuit 11 for generating an internal circuit preset signal PRESET, an internal power supply voltage (VINT) generating circuit 21 for generating an internal power supply voltage VINT, and various peripheral control circuits 22 supplied with the internal power supply voltage VINT and operated by the internal power supply voltage VINT.

The VINT generating circuit 21 and the peripheral control circuits 22 are supplied with a same internal circuit preset signal PRESET1 from the PRESET generating circuit 11. The internal circuit preset signal PRESET1 supplied to the VINT generating circuit 21 at power on serves to accelerate generation of the internal power supply voltage VINT by supplementarily connecting an external power supply VDD to the VINT generating circuit 21. Further, the internal circuit preset signal PRESET 1 supplied to the peripheral control circuits 22 serves to preset internal nodes of the peripheral control circuits 22. A plurality of internal circuit preset signals may be provided for a plurality of VINT generating circuits and a plurality of circuit groups operated by internal power supply voltages generated by the VINT generating circuits, respectively.

In connection with the internal circuit preset signal and power on, several related documents are known. In Japanese Unexamined Patent Application Publication (JP-A) No. 2002-111466 (Patent Document 1), a plurality of power-on reset circuits are provided in correspondence to different power supply voltages supplied from the outside. In Japanese Unexamined Patent Application Publication (JP-A) No. 2003-223783 (Patent Document 2), a power-on reset circuit supplied with an internal power supply voltage Vdd1 produces a plurality of power-on reset signals to reset a plurality of circuits supplied with the internal power supply voltage Vdd1. Japanese Unexamined Patent Application Publication (JP-A) No. 2004-279052 (Patent Document 3) discloses a plurality of power-on reset circuits different in threshold voltage. Japanese Unexamined Patent Application Publication (JP-A) No. 2004-152405 (Patent Document 4) discloses that, in a non-volatile memory having a plurality of chips, timings of power supply to the chips are delayed or shifted so as to prevent an increase of a rising current at power on.

In the above-mentioned Patent Documents 1, 2, and 3, a plurality of power-on reset signals are used. However, the same power-on reset signal is used for a circuit group supplied with one power supply voltage internally generated. In Patent Document 4, timings of supplying the power supply voltage are delayed and no preset operation is performed in synchronism with rising of the power supply voltage. Therefore, the techniques disclosed in the above-mentioned Patent Documents are different from this invention.

In the above-mentioned presetting in FIG. 1 by the internal circuit preset signal, there are several problems. As a first problem, optimum timings of the internal circuit preset signal are different among various internal circuits. This is because timings and periods of operations carried out at power on are different among the respective circuits. For example, in the VINT generating circuit, it is necessary to accelerate generation of the internal power supply voltage VINT by supplementarily connecting the external power supply VDD at power on. The peripheral circuits require timings and periods such that the internal nodes are preset preferably in the state where the internal power supply voltage VINT rises. As a second problem, there is a too small margin to sufficiently perform initial operations at power on by the use of the same internal circuit preset signal. This is because, as the same internal circuit preset signal is used, the various internal circuits perform the initial operations at power on at compromised timings.

As described above, in the semiconductor apparatus lowered in power supply voltage, various internal power supply voltages are used. The VINT generating circuit and the internal circuits using the power supply voltages generated by the VINT generating circuit are different in optimum operation timing at power on. It is necessary to perform presetting at optimum timings.

SUMMARY OF THE INVENTION

It is therefore an object of this invention to provide a semiconductor apparatus in which various internal circuits are supplied with optimum internal circuit preset signals to perform stable operations at power on.

In order to achieve the above-mentioned object, this invention basically adopts the following technique. It will readily be understood that this invention includes various changes and modifications within the scope of the technical gist of this invention.

That is, semiconductor apparatuses according to this invention are as follows:

(1) A semiconductor apparatus comprising an internal power supply voltage generating circuit and an internal circuit supplied with an internal power supply voltage generated by the internal power supply voltage generating circuit, wherein the internal power supply voltage generating circuit and the internal circuit are preset by different preset signals having different timings.

(2) The semiconductor apparatus according to the above-mentioned structure (1), the internal circuit comprising a plurality of internal circuits supplied with the internal power supply voltage generated by the internal power supply voltage generating circuit, wherein the internal power supply voltage generating circuit and the plurality of internal circuits are preset by different preset signals having different timings.

(3) The semiconductor apparatus according to the above-mentioned structure (1), further comprising an additional internal power supply voltage generating circuit for generating an additional internal power supply voltage, wherein the internal power supply voltage generating circuit, the internal circuit, and the additional internal power supply voltage generating circuit are preset by different preset signals having different timings.

(4) The semiconductor apparatus according to the above-mentioned structure (1), wherein the internal power supply voltage generating circuit steps up an external power supply voltage supplied from the outside.

(5) The semiconductor apparatus according to the above-mentioned structure (4), wherein the internal power supply voltage generating circuit is preset so as to stop operation of the internal power supply voltage generating circuit at an early stage after the external power supply voltage is supplied and to start operation of the internal power supply voltage generating circuit when the external power supply voltage rises to a predetermined level.

(6) The semiconductor apparatus according to the above-mentioned structure (1), wherein the internal power supply voltage generating circuit steps down an external power supply voltage supplied from the outside to produce a step-down voltage as a circuit output of the internal power supply voltage generating circuit.

(7) The semiconductor apparatus according to the above-mentioned structure (6), wherein the internal power supply voltage generating circuit is provided with a supplemental transistor and is preset so that the supplemental transistor is put into a conductive state at an early stage after the external power supply voltage is supplied, so as to quickly raise the circuit output to a predetermined level.

(8) The semiconductor apparatus according to the above-mentioned structure (3), wherein the internal power supply voltage generating circuit is a step-down power supply voltage generating circuit for stepping down an external power supply voltage supplied from the outside, the additional internal power supply voltage generating circuit is a step-up power supply voltage generating circuit for stepping up an additional external power supply voltage supplied from the outside, the step-up power supply voltage generating circuit is preset at a timing later than a timing of presetting the step-down power supply voltage generating circuit.

In the semiconductor apparatus according to this invention, each circuit group is supplied with the internal circuit preset signal at the optimum timing. With this structure, the following effects are obtained. As a first effect, by inputting the internal circuit preset signal at the optimum timing, each circuit group can perform an operation at power on at the optimum timing. As a second effect, rising of the internal power supply voltage is supplemented so as to optimally accelerate rising of the internal power supply voltage at power on. As a third effect, rising of the internal power supply voltage is suspended for a predetermined period to thereby suppress current consumption at power on and to stably generate the internal power supply voltage without unnecessary current loss.

BRIEF DESCRIPTION OF THE DRAWING

FIG. 13 is a timing chart of various reference power supply voltages and preset signals at power on;

FIG. 14 is a timing chart of various power supply voltages and the preset signals at power on;

DESCRIPTION OF THE PREFERRED EMBODIMENTS

Figure 1:
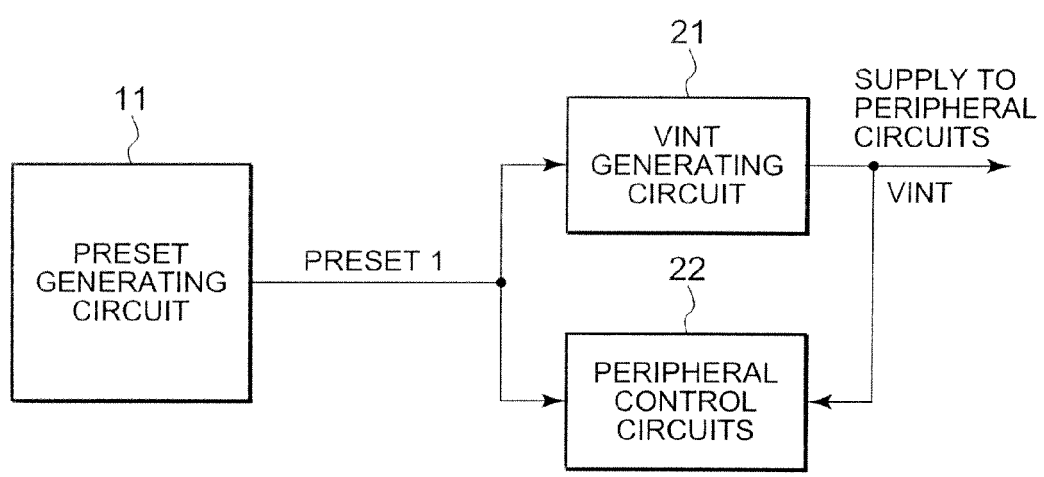
FIG. 1 is a schematic block diagram for describing a related semiconductor apparatus using a preset signal.

Now, embodiments of this invention will be described with reference to the drawing.

First Embodiment

Referring to FIGS. 2 through 14, a first embodiment of this invention will be described.

Figure 2:
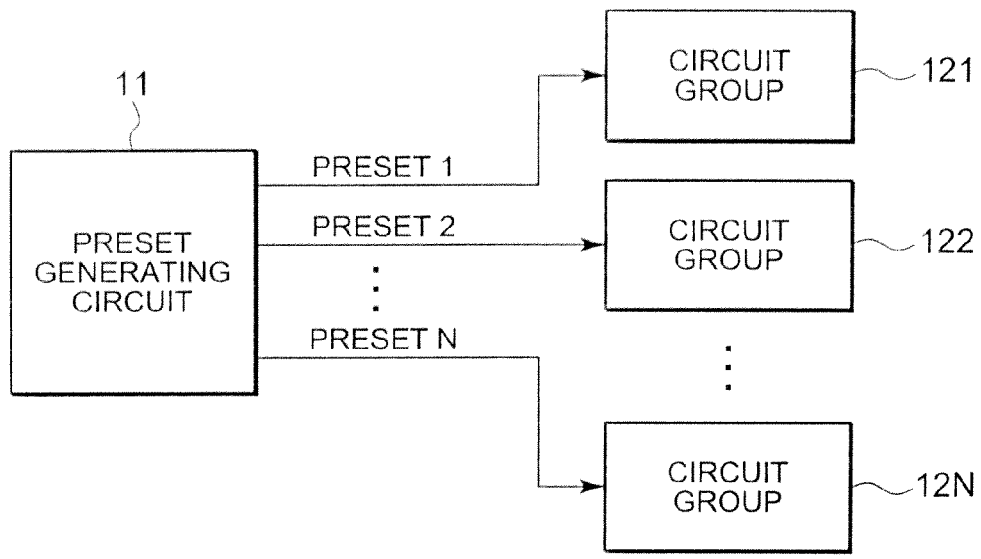
FIG. 2 is a schematic block diagram for describing a basic concept of a semiconductor apparatus using a preset signal according to this invention.

Referring to FIG. 2 showing a basic concept of this invention, a preset signal (PRESET) generating circuit 11 generates internal circuit preset signals PRESET1 to PRESETN which are supplied to a plurality of circuit groups 121 to 12N to perform initializing or presetting of the circuit groups 121 to 12N at power on of the circuit groups 121 to 12N. The preset signals in this invention are referred to as power-on reset signals in the related documents.

Figure 3:
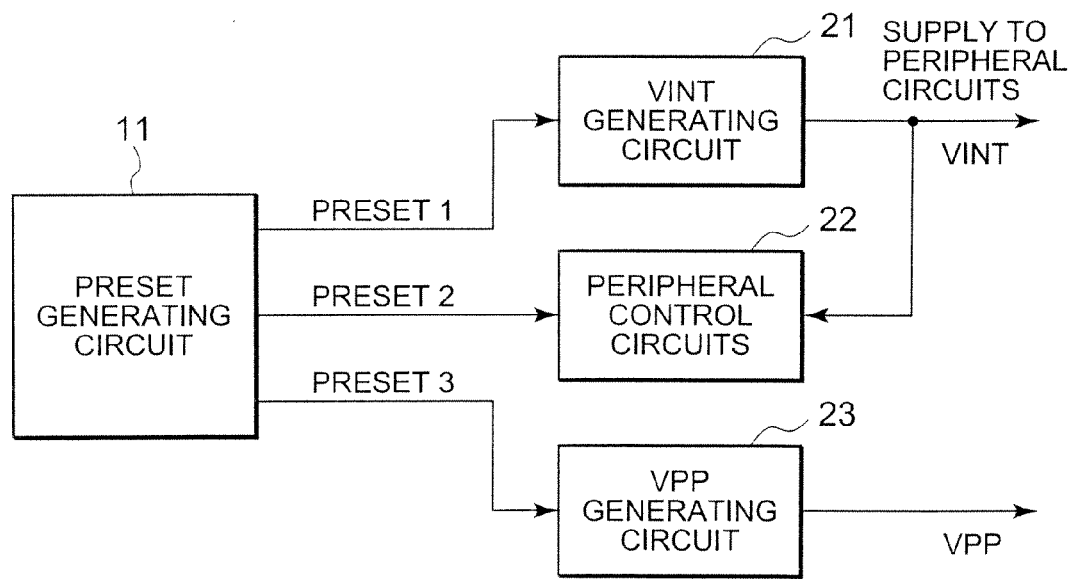
FIG. 3 is a schematic block diagram for describing a semiconductor apparatus using a preset signal according to a first embodiment of this invention.

Referring to FIG. 3, the circuit groups 121 to 123 among the circuit groups 121 to 12N in FIG. 2 are replaced by a power supply voltage (VINT) generating circuit, various peripheral control circuits operated by an internal power supply voltage VINT, and a power supply voltage (VPP) generating circuit, respectively.

The PRESET generating circuit 11 generates the internal circuit preset signals PRESET1 to PRESET3. The VINT generating circuit 21 generates an internal power supply voltage VINT as a step-down voltage lower than an external power supply voltage VDD supplied from the outside. The various peripheral control circuits 22 are operated by the internal power supply voltage VINT. The VPP generating circuit 23 generates an internal power supply voltage VPP as a step-up voltage higher than the external power supply voltage VDD. The VINT generating circuit 21 is supplied with the internal circuit preset signal PRESET1. The various peripheral control circuits 22 operated by the internal power supply voltage VINT are supplied with the internal circuit preset signal PRESET2. The VPP generating circuit 23 is supplied with the internal circuit preset signal PRESET3. At power on, each circuit is initialized by each corresponding internal circuit preset signal supplied thereto. The VINT generating circuit 21 and the VPP generating circuit 23 supply the power supply voltages to other peripheral circuits.

Figure 4:
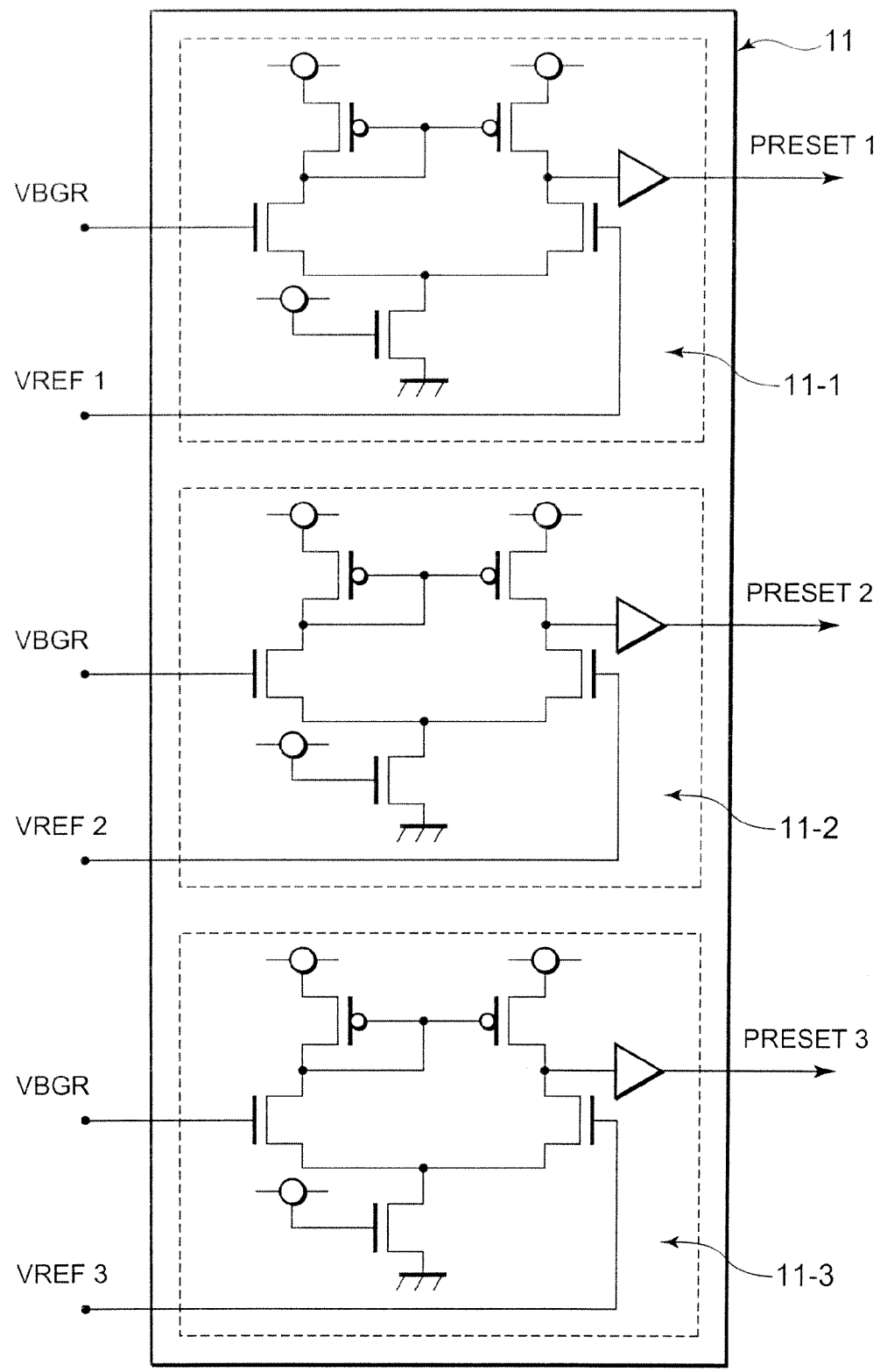
FIG. 4 is a circuit diagram of a PRESET generating circuit.

Referring to FIG. 4, the PRESET generating circuit 11 comprises three circuit portions, i.e., PRESET generating circuits 11-1 to 11-3 for producing the internal circuit preset signals PRESET1 to PRESET3, respectively. The PRESET generating circuit 11-1 is a comparator circuit for comparing a basic reference power supply voltage VBGR and a reference power supply voltage VREF1 used for generation of an internal power supply to produce the internal circuit preset signal PRESET1. If the basic reference power supply voltage VBGR has a potential level higher than that of the reference power supply voltage VREF1, the internal circuit preset signal PRESET1 has a "H level". If the basic reference power supply voltage VBGR has a potential level lower than that of the reference power supply voltage VREF1, the internal circuit preset signal PRESET1 has a "L level".

Similarly, the PRESET generating circuit 11-2 is a comparator circuit for comparing the basic reference power supply voltage VBGR and a reference power supply voltage VREF2 to produce the internal circuit preset signal PRESET2. The PRESET generating circuit 11-3 is a comparator circuit for comparing the basic reference power supply voltage VBGR and a reference power supply voltage VREF3 to produce the internal circuit preset signal PRESET3. Each of the PRESET generating circuits 11-2 and 11-3 is similar in structure and operation to the PRESET generating circuit 11-1.

Figure 5:
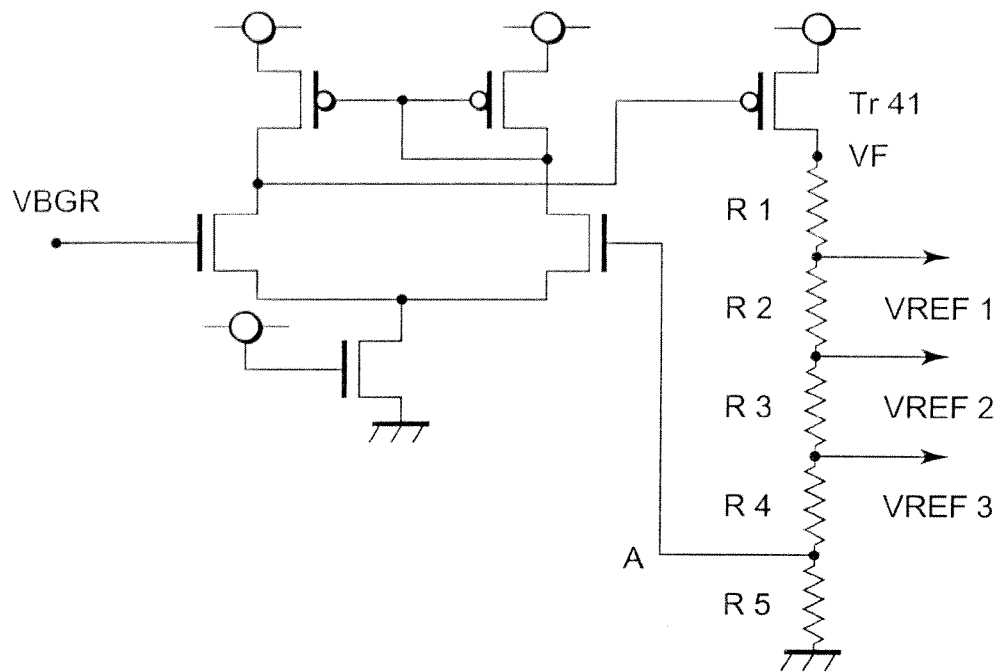
FIG. 5 is a circuit diagram of a VREF generating circuit.

Referring to FIG. 5, a reference voltage (VREF) generating circuit for generating the reference power supply voltage VREF comprises a comparator circuit and a plurality of resistors R1, R2, R3, R4, and R5 connected in series to a transistor Tr41 between a power supply and a ground potential. The comparator circuit produces an output signal for controlling conduction of the transistor Tr41 so that the reference power supply voltages VREF1, VREF2, and VREF3 are produced from respective nodes formed by resistive division (namely, voltage division by the resistors). The comparator circuit compares the basic reference power supply voltage VBGR and a potential at a node A between the resistors R4 and R5 connected in series. If the basic reference power supply voltage VBGR has a potential level higher than that at the node A, the comparator circuit produces a L level to turn the transistor Tr41 into a conductive state so that the resistors are supplied with a voltage. A potential at a node VF is increased so that the reference power supply voltages VREF1 to VREF3 are produced. When the potential of the basic reference power supply voltage VBGR is equal to the potential at the node A, a stable potential condition is obtained.

In this embodiment, the reference voltages are produced by resistive division. However, this invention is not limited thereto but is applicable to any circuit having a similar function. In FIGS. 4 and 5, the three reference voltages are produced and the three internal circuit preset signals are generated. However, the number of the reference voltages and the number of the internal circuit preset signals are not particularly limited but may be any desired number.

Figure 6:
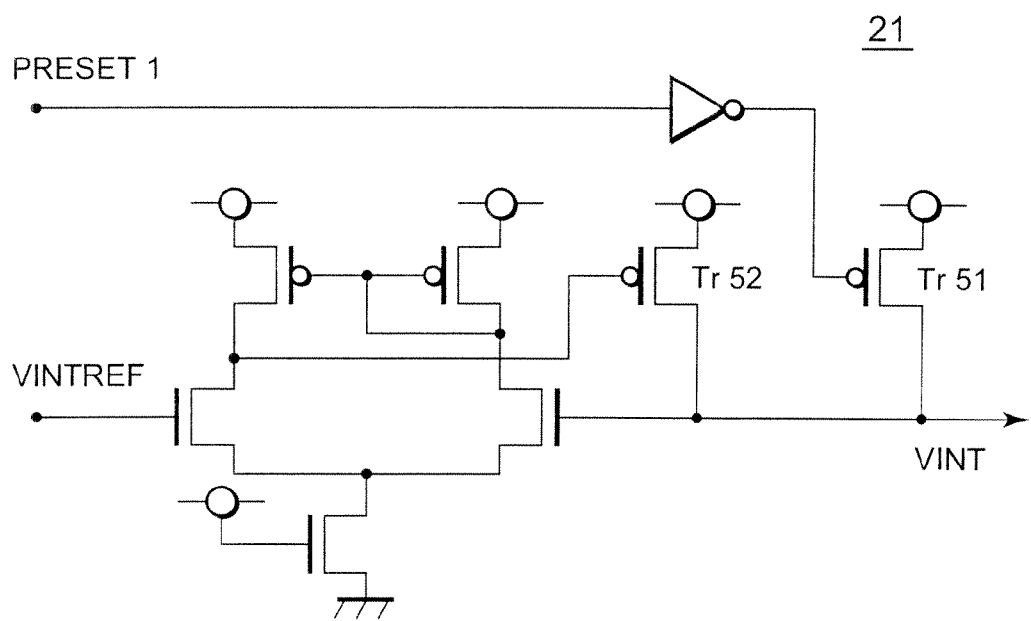
FIG. 6 is a circuit diagram of a VINT generating circuit using the preset signal of this invention.

Referring to FIG. 6, the VINT generating circuit 21 comprises a comparator circuit and transistors Tr51 and Tr52 for producing the internal power supply voltage VINT as a circuit output of the VINT generating circuit 21. The comparator circuit compares levels of a reference power supply voltage VINTREF and the internal power supply voltage VINT to produce an output signal supplied to a gate of the transistor Tr52. If the level of the reference power supply voltage VINTREF is higher than that of the internal power supply voltage VINT, the transistor Tr52 is turned into a conductive state. An electric current flows from the external power supply voltage VDD to the internal power supply voltage VINT so that the level of the internal power supply voltage VINT is elevated. If the level of the reference power supply voltage VINTREF is lower than that of the internal power supply voltage VINT, the transistor Tr52 is turned into a non-conductive state. The external power supply voltage VDD is disconnected from the internal power supply voltage VINT.

When the internal circuit preset signal PRESET1 has a "H level" at power on, the transistor Tr51 with its gate supplied with an inverted signal of the internal circuit preset signal PRESET1 is turned into a conductive state. An electric current supplementally flows from the external power supply voltage VDD to the internal power supply voltage VINT so that the level of the internal power supply voltage VINT is elevated. Thus, the transistor Tr51 serves as a supplemental transistor which quickly raises the circuit output of the VINT generating circuit 21 to a predetermined level. That is, at power on, the VINT generating circuit 21 can quickly raise the internal power supply voltage VINT because the supplemental (or auxiliary) transistor Tr51 is turned into a conductive state by the internal circuit preset signal PRESET1. In the state where the internal power supply voltage VINT rises to some extent, the internal circuit preset signal PRESET1 transits to a "L level". As a consequence, the transistor Tr51 is turned into a non-conductive state. In a stable power supply condition, the reference power supply voltage VINTREF is set to be equal to the internal power supply voltage VINT. Thus, the internal power supply voltage VINT is stably generated by the transistor Tr52.

Figure 7:
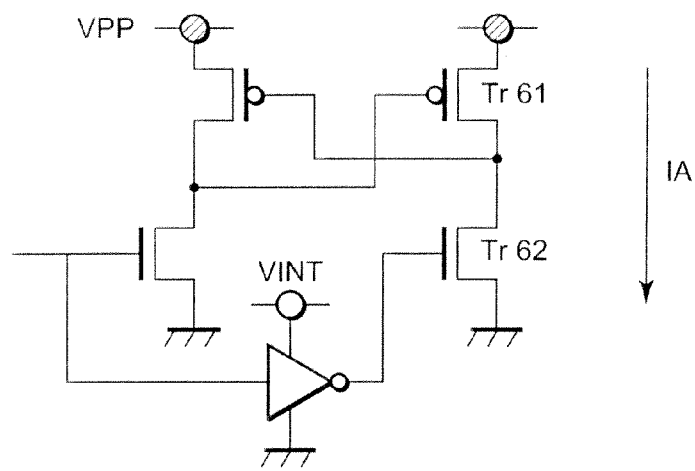
FIG. 7 is a block diagram of a level conversion circuit.

Referring to FIG. 7, a level conversion circuit will be described. At power on, each level is unstable. Therefore, transistors Tr61 and Tr62 may become unstably conductive so that a penetrating current IA flows from the internal step-up power supply voltage VPP to the ground potential GND. In order to prevent generation of the penetrating current IA, it is effective to stop the VPP generating circuit until the internal power supply voltage VINT rises to some extent at power on. Hereinafter, description will be made of presetting in the VPP generating circuit using the internal circuit preset signal.

Figure 8:
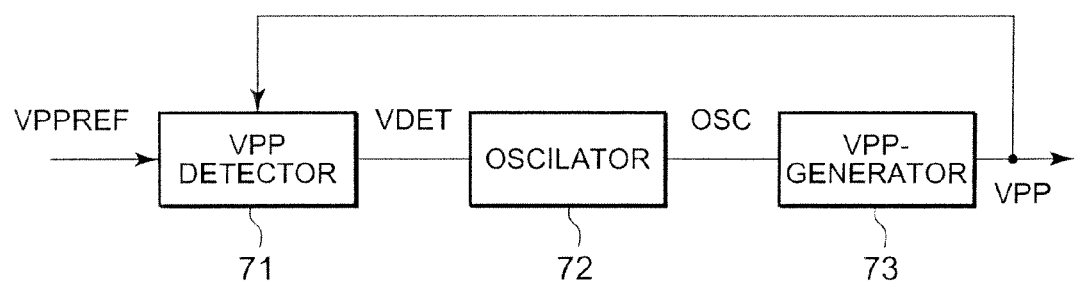
FIG. 8 is a block diagram of a VPP generating circuit using the preset signal of this invention.

Referring to FIG. 8, the VPP generating circuit comprises a VPP detector 71, an oscillator 72, and a VPP generator 73. The VPP detector 71 compares the step-up power supply voltage VPP (actually, a node voltage VPPA obtained by dividing the power supply voltage VPP) and a reference power supply voltage VPPREF. If the step-up power supply voltage VPP is lower than the reference power supply voltage VPPREF, the VPP detector 71 produces a detection signal VDET for oscillating the oscillator 72. Supplied with the detection signal VDET, the oscillator 72 oscillates to produce a clock OSC. The VPP generator 73 is supplied with the clock OSC and produces the step-up power supply voltage VPP.

Figure 9:
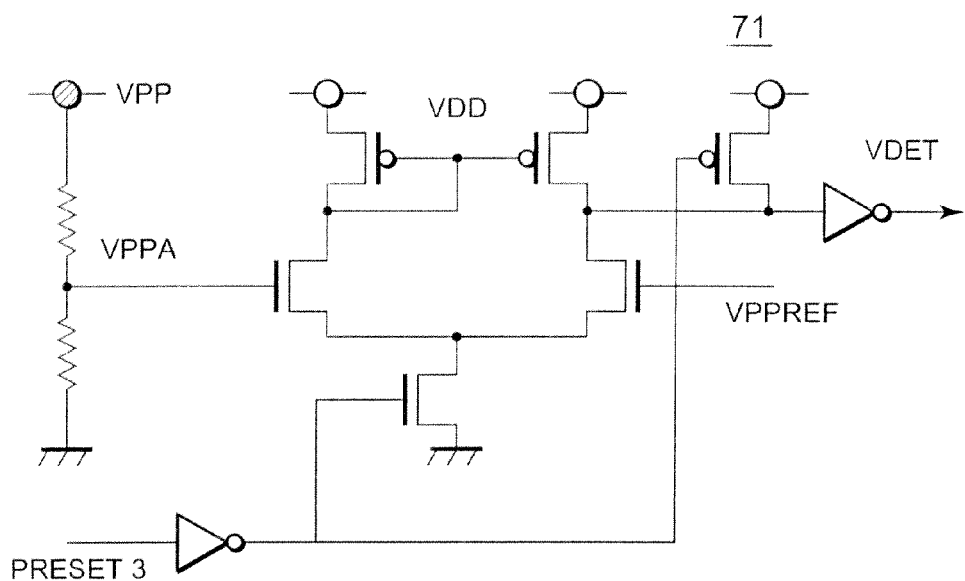
FIG. 9 is a circuit diagram of a VPP detector in FIG. 8.
Figure 10:
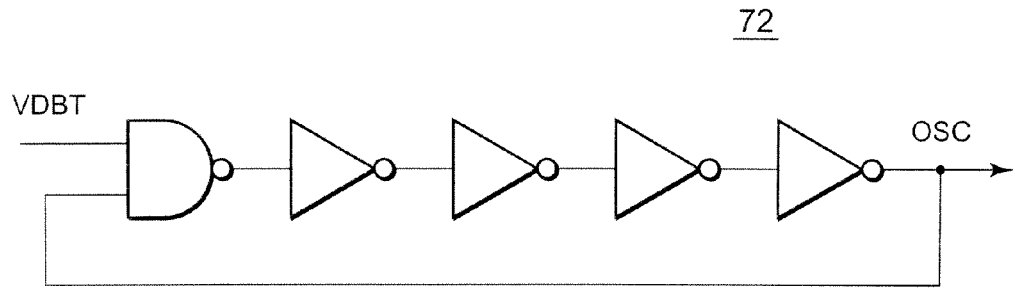
FIG. 10 is a circuit diagram of an oscillator in FIG. 8.

Referring to FIG. 9, the VPP detector 71 comprises a comparator for comparing levels of the node voltage VPPA obtained by resistive division of the step-up power supply voltage VPP and the reference power supply voltage VPPREF, and an output portion for outputting the detection signal VDET. If the reference power supply voltage VPPREF is higher than the node voltage VPPA, the detection signal VDET has a "H level" to oscillate the oscillator 72. At power on, by the internal circuit preset signal PRESET3 of a "H level", the comparator is stopped in operation and the detection signal VDET has a "L level". Referring to FIG. 10, the oscillator 72 produces the clock OSC. When the detection signal VDET has a "L level", the clock OSC is kept constant at a "H level" and an oscillating operation is stopped. When the detection signal VDET has a "H level", the oscillation is started to alternately repeat a "H level" and a "L level" so that the clock OSC is produced.

Figure 11:
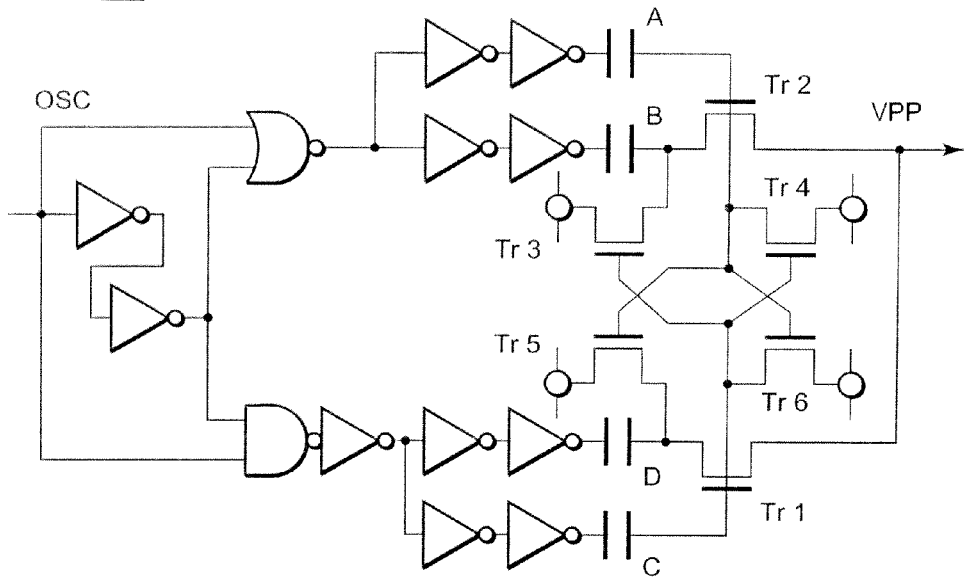
FIG. 11 is a circuit block diagram of a VPP generator in FIG. 8.
Figure 12:
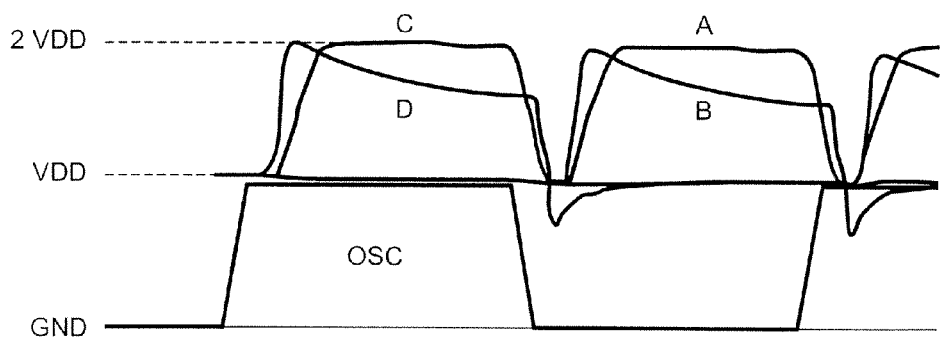
FIG. 12 is an operation waveform chart of the VPP generator in FIG. 8.

Referring to FIGS. 11 and 12, the VPP generator 73 will be described. For simplicity of description, FIG. 12 shows only a stationary step-up operation after the external power supply voltage rises.

At power on (not shown), by the internal circuit preset signal PRESET3 having a "H level", the VPP detector 71 is stopped in operation. The oscillator 72 also stops operation and the clock OSC as an output of the oscillator 72 is fixedly kept at a "H level". The VPP generator 73 also stops operation. As will later be described, when the external power supply voltage rises to around a predetermined voltage VDD after power on, the internal circuit preset signal PRESET3 is turned into a "L level". As a consequence, each of the VPP detector 71, the oscillator 72, and the VPP generator 73 starts operation. Thus, those circuits involved in VPP generation stop operation until the external power supply voltage rises to around the predetermined voltage VDD. At this time, the VPP generator 73 stops the step-up operation. Following rising of the external power supply voltage, the step-up voltage VPP is raised to around the power supply voltage VDD.

After the external power supply voltage rises, when the clock OSC has a "H level", a potential at a node D rises from the predetermined voltage VDD to a level around 2 VDD. A potential at the node C also rises from the predetermined voltage VDD to the level around 2 VDD. The transistor Tr1 is turned into a conductive state so that the step-up voltage VPP is supplied with an electric current. Following supply of the electric current, the potential at the node D transits to a level around the step-up voltage VPP. At this time, transistors Tr3 and Tr4 are in a conductive state and nodes A and B are precharged with the predetermined voltage VDD. When the clock OSC has a "L level", the potential at the node C is lowered to the predetermined voltage VDD and the potential at the node D is also lowered to the level not higher than the predetermined voltage VDD. Then, transistors Tr5 and Tr6 are turned into a conductive state so that the nodes C and D are precharged with the predetermined voltage VDD. The potential at the node B is elevated from the predetermined voltage VDD to the level around 2 VDD. The potential at the node A is also elevated from the predetermined voltage VDD to the level around 2 VDD. The transistor Tr2 is turned into a conductive state so that the step-up voltage VPP is supplied with an electric current. Following supply of the electric current, the potential at the node B transits to the level around the step-up power supply voltage VPP. Subsequently, the above-mentioned operation is repeated so that the step-up power supply voltage VPP is supplied with an electric current.

When the step-up power supply voltage VPP is stepped up to become higher than the predetermined voltage VDD, the VPP detector 71 in FIG. 9 produces the detection signal VDET of a "L level". The oscillator 72 stops oscillation and the clock OSC is kept at a "H level". The node D has a VPP level and the node C has a level around 2 VDD. The nodes A and B are kept precharged with the predetermined voltage VDD. In this state, when the step-up power supply voltage VPP is consumed by the internal circuits and the voltage VPP is lowered, the VPP detector 71 produces the detection signal VDET of a "H level" to start the step-up operation again.

As described above, at power on, the step-up voltage generating circuit is stopped in operation in response to the internal circuit preset signal PRESET3. Because the operation is stopped, an unstable operation at rising of the external power supply voltage is avoided and a useless current such as a penetrating current is not consumed.

Figure 13:
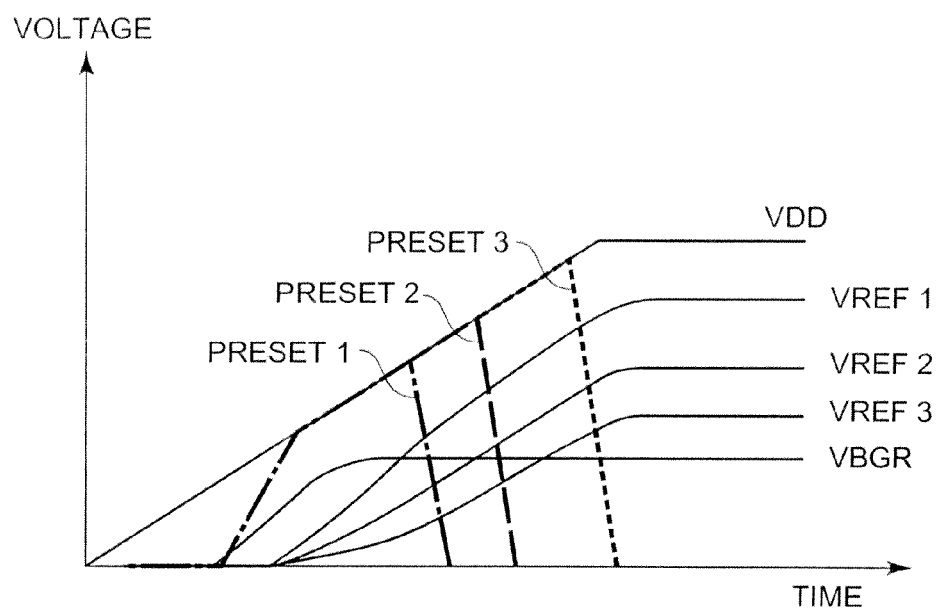

Referring to FIG. 13 in combination with FIGS. 4 and 5, description will be made of the various reference power supply voltages and the preset signals (PRESET) at power on.

By the external power supply voltage VDD supplied from the outside, the basic reference power supply voltage VBGR starts to rise after the time instant when the external power supply voltage VDD rises to a level not lower than a predetermined voltage. The reference power supply voltages VREF1 to VREF3 are potentials obtained by resistive division and start to rise from a lower level. The internal circuit preset signals PRESET1 to PRESET3 of the PRESET generating circuit transit but are kept at a "H level" following the external power supply voltage VDD. When the external power supply voltage VDD is gradually elevated, the potentials of the reference power supply voltages VREF1 to VREF3 also rise. When the reference power supply voltage VREF1 becomes higher in potential than the basic reference power supply voltage VBGR, the internal circuit preset signal PRESET1 of the PRESET generating circuit transits to a "L level". Similarly, following elevation of the external power supply voltage VDD, the potentials of the reference power supply voltages VREF2 and VREF3 are elevated also. When the potentials of the reference power supply voltages VREF2 and VREF3 become higher than the potential of the basic reference power supply voltage VBGR, the internal circuit preset signals PRESET2 and PRESET3 of the PRESET generating circuit successively transit to a "L level" following elevation of the external power supply voltage VDD.

For example, as illustrated in FIG. 5, the nodes of the resistors are set to potentials of the basic reference power supply voltage VGBR, the reference power supply voltage VREF3, the reference power supply voltage VREF2, and the reference power supply voltage VREF1 in the ascending order. The internal circuit preset signal PRESET1 generated from the reference power supply voltage VREF1 is used as a preset signal for a circuit desired to be preset at an early stage of rising of the external power supply voltage VDD. On the contrary, the internal circuit preset signal PRESET3 generated from the reference power supply voltage VREF3 is used as a preset signal for a circuit desired to be preset at a time instant when the external power supply voltage VDD substantially rises.

Figure 14:
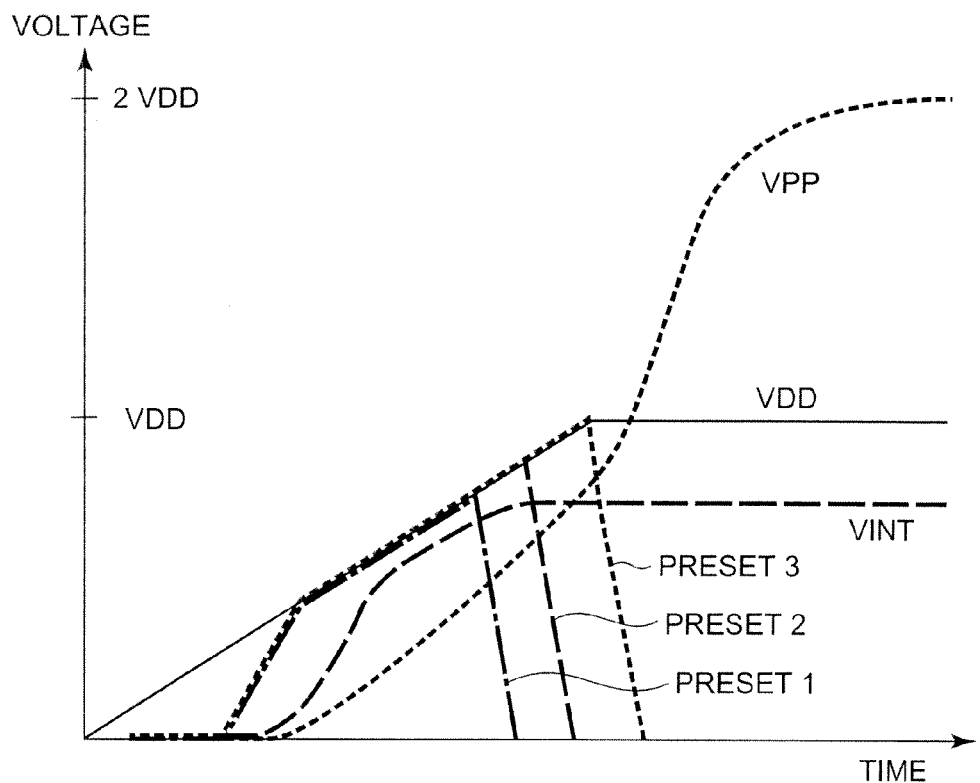

Referring to FIG. 14 in combination with FIG. 6, description will be made of the respective power supply voltages and the preset signals (PRESET) at power on. At first, by supplying the external power supply voltage VDD, the preset signals PRESET1 to PRESET3 of the PRESET generating circuit transit but are kept at a "H level".

The preset signal PRESET1, during the period of a "H level", turns the transistor Tr51 connecting the internal power supply voltage VINT and the external power supply voltage VDD into a conductive state to accelerate rising of the internal power supply voltage VINT. Then, at a time instant when the internal power supply voltage VINT substantially rises, the preset signal PRESET1 transits to a "L level" and turns the transistor Tr51 connecting the internal power supply voltage VINT and the external power supply voltage VDD into a non-conductive state.

The preset signal PRESET2, during the period of a "H level", resets the peripheral control circuits in the apparatus. After the internal power supply voltage VINT substantially rises and the potentials of the respective nodes are stabilized, the preset signal PRESET2 turns into a "L level" and resetting of the peripheral control circuits is finished. The preset signal PRESET3, during the period of a "H level", stops generation of the internal power supply voltage VPP. After the external power supply voltage VDD substantially rises, the preset signal PRESET3 turns into a "L level". The VPP generating circuit is started to set the internal power supply voltage VPP at a predetermined level.

In this embodiment, the internal circuit preset signals PRESET1 to PRESET3 are used as the signal for accelerating rising of the internal power supply voltage VINT, the reset signal for resetting the peripheral control circuits, and the stop signal for stopping the VPP generating circuit, respectively. However, this invention is not limited thereto but appropriate presetting may be made so that various internal circuits are operated at optimum timings and the internal power supply voltage is stably generated without useless power consumption at power on. Further, a plurality of peripheral control circuit groups supplied with the internal power supply voltage VINT may be provided and supplied with different internal circuit preset signals PRESET to be preset.

In this embodiment, at power on, the power supply voltage generating circuit and the internal circuits using the power supply voltage generated by the power supply voltage generating circuit are preset by the different preset signals. These circuits are optimally preset by the different preset signals so that the operations at power on are carried out at optimum timings. Further, rising of the internal power supply voltage is supplemented and rising of the internal power supply voltage is accelerated. By stopping the operation upon rising the power supply voltage, current consumption is suppressed. Thus, without consuming a useless electric current, the internal power supply voltage can stably be generated.

Second Embodiment

Figure 15:
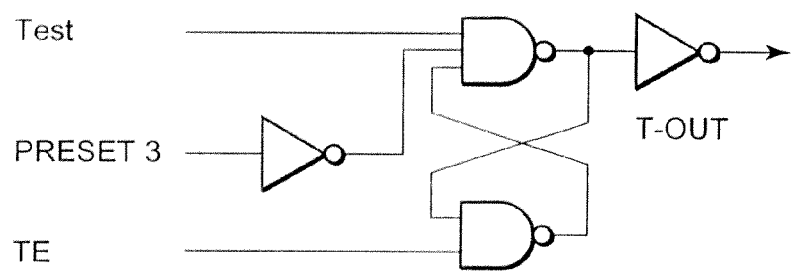
FIG. 15 shows an internal control signal generating circuit using a preset signal according to a second embodiment of this invention.
Figure 16:
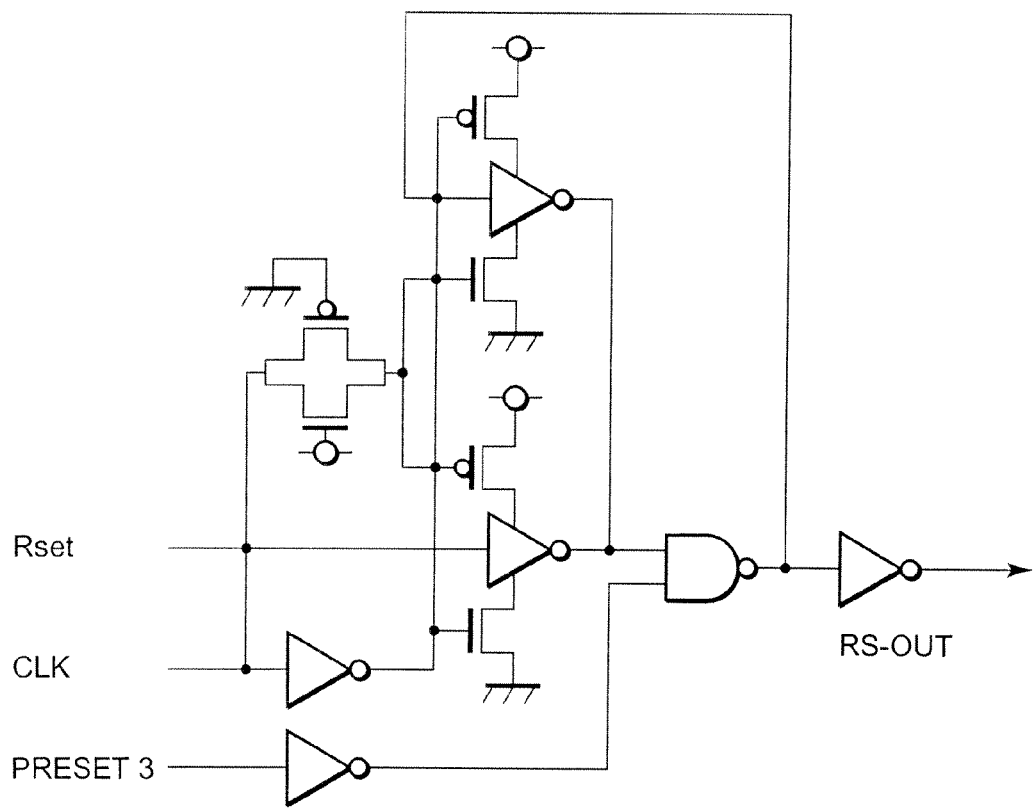
FIG. 16 shows a register control signal generating circuit using the preset signal according to the second embodiment.
Figure 17:
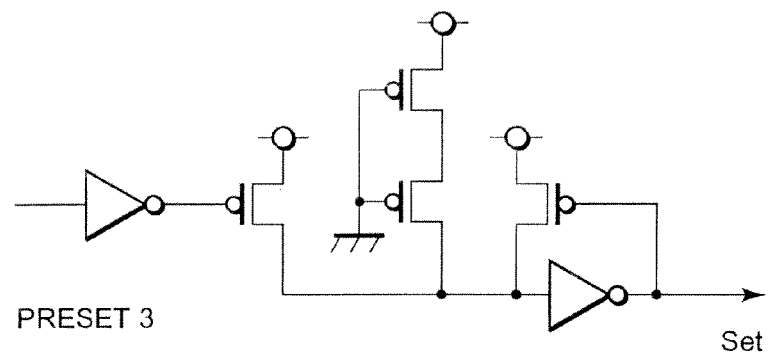
FIG. 17 shows a set supplementing circuit using the preset signal according to the second embodiment.

Referring to FIGS. 15 to 17, description will be made of a second embodiment of this invention.

Referring to FIG. 15, the internal control signal generating circuit is used in a test mode or the like. As a power supply voltage, use is made of the internal power supply voltage VINT preset by the internal circuit preset signal PRESET1. Inside the circuit, presetting is performed by the internal circuit preset signal PRESET3. Those circuits involved in the test mode are supplied with the internal power supply voltage VINT. Actually, however, the test mode operation is carried out after the power supply voltage sufficiently rises. Therefore, at power on, it is effective to perform presetting by the preset signal.

The internal control signal generating circuit comprises a first NAND circuit supplied with a test signal Test and a second NAND circuit supplied with a test enable signal TE. The first and the second NAND circuits are connected to each other so that an output of one circuit is supplied as an input to the other and vice versa. Further, the internal control signal generating circuit comprises a first inverter circuit supplied with the output of the first NAND circuit. In this embodiment, a second inverter circuit is added which is supplied with the internal circuit preset signal PRESET3. The internal circuit preset signal PRESET3 inverted by the second inverter circuit is supplied to the first NAND circuit.

At power on, the second inverter circuit supplied with the internal circuit preset signal PRESET3 produces an output of a "L level". The first NAND circuit supplied with the output of a "L level" produces an output of a "H level" irrespective of a level of the test signal Test. Therefore, the first inverter circuit produces an output of a "L level" as a test signal output T-OUT. Thus, the internal control signal generating circuit at power on is preset by the internal circuit preset signal PRESET3 and a next-stage circuit is preset by a control signal output produced by the internal control signal generating circuit. When the power supply voltage rises and the internal circuit preset signal PRESET3 turns into a "L level", a "H level" as an inverted level is supplied to the NAND circuit. The NAND circuit supplied with a "H level" determines its logical output by a remaining input signal and performs a known operation.

Referring to FIG. 16, a register control signal generating circuit serves to preset internal nodes of a latch circuit of a mode register or the like. As a power supply voltage, the internal power supply voltage VINT is used. By the internal circuit preset signal PRESET3, the register control signal generating circuit produces a control signal for setting potentials of the internal nodes of the register. The clock signal CLK is a one-shot pulse upon setting the register. When the register is set, the control signal has a "L level". A reset signal Rset supplied to the register control signal generating circuit is inverted to produce a set signal output RS-OUT. Thus, the state of the register is set. The basic structure is already known and detailed description thereof will be omitted. In this embodiment, these circuits are supplied with the internal circuit preset signal PRESET3 so that presetting at power on is performed.

At power on, an inverter circuit supplied with the internal circuit preset signal PRESET3 produces an output of a "L level". A NAND circuit supplied with the output of a "L level" produces an output of a "H level" irrespective of a level of the reset signal Rset supplied thereto. Therefore, the inverter circuit at an output stage produces an output of a "L level" as a set signal output S-OUT. By the set signal output S-OUT, the internal nodes of the register at power on are set. When the power supply voltage rises and the internal circuit preset signal PRESET3 turns into a "L level", a "H level" as an inverted level is supplied to the NAND circuit. The NAND circuit supplied with a "H level" determines its logical output by another input signal and performs a known operation. In this circuit, as the power supply voltage, the internal power supply voltage VINT preset by the internal circuit preset signal PRESET1 is used. Inside the circuit, presetting is performed by the internal circuit preset signal PRESET3.

Referring to FIG. 17, a set supplementing circuit is illustrated. For example, in a semiconductor memory, switching between a 4-bit product and an 8-bit product is performed as bonding option. In this case, selection is performed by giving a set signal of a "H level" or a "L level". Herein, a circuit for producing an output of a "L level" is supplemented by a preset signal at power on so as to quickly set the output to a "L level". Generally, the circuit is supplied with an external power supply voltage VDD.

For example, the set supplementing circuit produces an output of a "L level", The set supplementing circuit comprises an inverter circuit, a transistor for pulling up an input of the inverter circuit to a power supply voltage, and a transistor for pulling up the input by an output of the inverter circuit. These transistors merely fix input nodes of the inverter circuit to a "H level" and are designed to have a very small driving ability. The above-mentioned circuit is additionally provided with an inverter circuit supplied with the internal circuit preset signal PRESET3 and a pull-up transistor having a gate supplied with an output of the inverter circuit.

At power on, the internal circuit preset signal PRESET3 has a "H level". By the additional pull-up transistor, the input node connected to a drain of the additional pull-up transistor is quickly raised to a "H level". Thus, at power on, the additional pull-up transistor quickly pulls up the node to a "H level" and quickly fixes the set signal Set to a "L level. When the power supply voltage rises and the internal circuit preset signal PRESET3 turns into a "L level", the additional pull-up transistor is turned off and pull-up is performed by normal transistors alone.

In this embodiment, the various peripheral control circuits are preset by the internal circuit preset signal PRESET3. The power supply voltages used for the peripheral control circuits include the internal power supply voltage VINT and the external power supply voltage VDD. Thus, in the peripheral control circuits using the various power supply voltages, presetting can be made by the various internal circuit preset signals PRESET. Thus, by presetting the optimum timings required by the peripheral control circuits, it is possible to perform the operations at power on at optimum timings.

Third Embodiment

Figure 18:
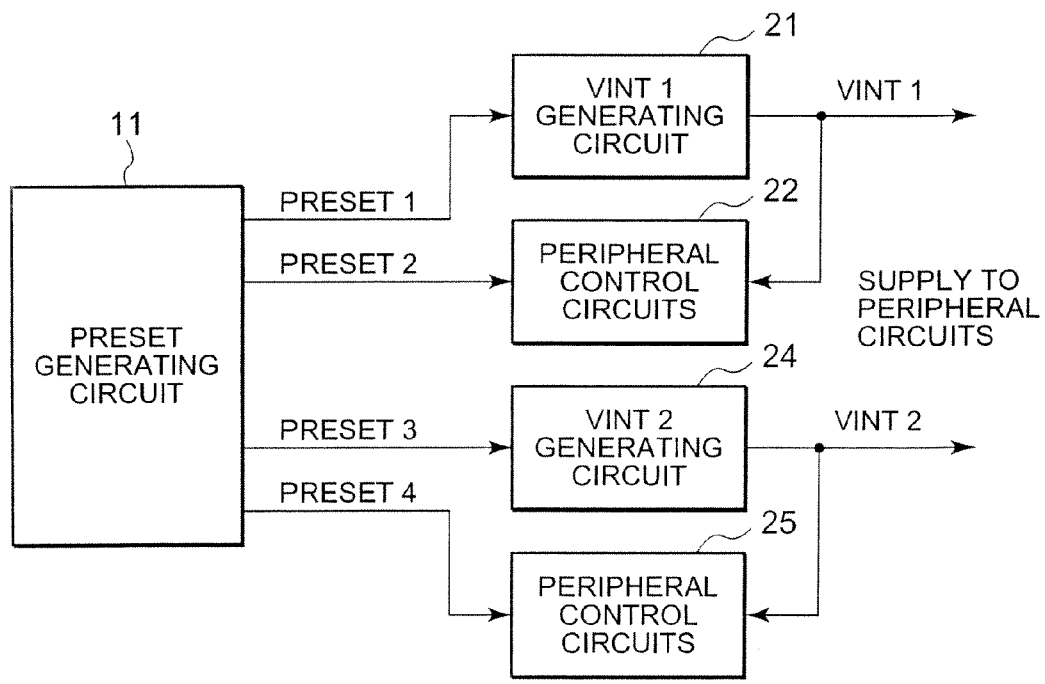
FIG. 18 is a schematic block diagram for describing a semiconductor apparatus using a preset signal according to a third embodiment of this invention.

Referring to FIG. 18, a third embodiment of this invention will be described. Referring to FIG. 18, the third embodiment comprises a PRESET generating circuit 11, two power supply voltage generating circuits 21 and 24, and peripheral control circuits 22 and 25 using power supply voltages generated by the power supply voltage generating circuits 21 and 24, respectively. Similar parts are designated by like reference numerals and description thereof will be omitted.

The PRESET generating circuit 11 produces four internal circuit preset signals PRESET1, PRESET2, PRESET3, and PRESET4. The internal circuit preset signal PRESET1 is supplied to the internal power supply voltage (VINT1) generating circuit 21 for generating an internal power supply voltage VINT1. The preset signal PRESET2 is supplied to the peripheral control circuit 22 using the internal power supply voltage VINT1. The preset signal PRESET3 is supplied to the power supply voltage (VINT2) generating circuit 24 for generating an internal power supply voltage VINT2. The internal circuit preset signal PRESET4 is supplied to the various peripheral control circuits 25 using the internal power supply voltage VINT2.

Thus, for a plurality of circuit groups driven by different internal power supply voltages, internal circuit preset signals are generated at optimum timings for various circuits in the respective circuit groups so as to perform optimum operations. In the first embodiment, three reference power supply voltages and the three internal circuit preset signals PRESET are used. It will readily be understood that the four reference power supply voltages and the four internal circuit preset signals PRESET can be generated by a similar circuit structure. Therefore, the circuit structure and the operation are similar to those of the first embodiment and description thereof will be omitted.

In this embodiment, at power on, a plurality of internal power supply voltage generating circuits and a plurality of internal circuit groups using the internal power supply voltages generated by the internal power supply voltage generating circuits are preset by different preset signals. By performing optimum presetting of the respective circuits by the use of the different preset signals, it is possible to perform the operations at power on at optimum timings.

Although this invention has been described in conjunction with a few preferred embodiments thereof, this invention is not limited to the foregoing embodiments but may be modified in various other manners within the scope of the appended claims.

What is claimed is:

1. A device, comprising:
   a first internal voltage generation circuit generating a first internal voltage in response to an external power supply voltage;
   a second internal voltage generation circuit generating a second internal voltage in response to the external power supply voltage, the second internal voltage being different in voltage level from the first internal voltage; and
   a preset signal generation circuit responding to a power-on of the external power supply voltage to the device and generating, independently of the first internal voltage, first and second preset signals that bring the first and the second internal voltage generation circuits into respective initial states,
   the preset signal generating circuit stopping generation of the first preset signal when the external power supply voltage reaches a first voltage level and stopping generation of the second preset signal when the external power supply voltage reaches a second voltage level different from the first voltage level,
   the first internal voltage generation circuit being released from its initial state in response to stopping the generation of the first preset signal to be allowed to generate the first internal voltage, and
   the second internal voltage generation circuit being released from its initial state in response to stopping the generation of the second preset signal to be allowed to generate the second internal voltage.

2. The device as claimed in claim 1, wherein the first internal voltage generation circuit includes a step-down circuit and the second internal voltage generation circuit includes a bootstrap circuit.

3. The device as claimed in claim 2, wherein the step-down circuit of the first internal voltage generation circuit and the bootstrap circuit of the second internal voltage generation circuit operate on the external power supply voltage.

4. The device as claimed in claim 1, wherein the first voltage level is smaller than the second voltage level.

5. The device as claimed in claim 1, wherein the first internal voltage generation circuit comprises an output node, a first voltage generator coupled to the output node, a power supply node receiving the external power supply voltage, and a transistor including a first main electrode coupled to the power supply node, a second main electrode coupled to the output node, and a control electrode receiving the first preset signal.

6. The device as claimed in claim 5, wherein the transistor of the first internal voltage generation circuit is rendered conductive during a first period of time when the first preset signal is supplied to the first internal voltage generation circuit and rendered nonconductive after the stopping the generation of the first preset signal.

7. The device as claimed in claim 1, wherein the first internal voltage generation circuit comprises an output node, a first voltage generator coupled to the output node, a power supply node receiving the external power supply voltage, and a transistor coupled between the power supply node and the output node, the transistor being rendered conductive in response to the first preset signal.

8. The device as claimed in claim 1, wherein the first internal voltage generation circuit includes a first voltage generator responding to a first reference voltage and a feedback voltage relative to the first internal voltage to generate the first internal voltage during a first period of time when the first preset signal is supplied to the first internal voltage generation circuit and keeps responding to the first reference voltage and the feedback voltage to generate the first internal voltage after the stopping the generation of the first preset signal.

9. The device as claimed in claim 1, wherein the second internal voltage generation circuit further includes an oscillation signal generating circuit generating an oscillation signal, and a first voltage generator generating the second internal voltage in response to the oscillation signal.

10. The device as claimed in claim 9, wherein the oscillation signal generating circuit of the second internal voltage generation circuit stops generation of the oscillation signal during a first period of time when the second preset signal is supplied to the second internal voltage generation circuit, and the oscillation signal generating circuit generates the oscillation signal in response to stopping the generation of the second preset signal.

11. The device as claimed in claim 9, wherein the oscillation signal generating circuit of the second internal voltage generation circuit includes a detector responding to the second internal voltage and a first reference voltage to produce a detection signal, and an oscillator generating the oscillation signal in response to the detection signal.

12. The device as claimed in claim 11, wherein the detection signal is brought in response to the second preset signal into a level that stops generation of the oscillator.

13. The device as claimed in claim 1, wherein the preset signal generation circuit stops the generation of the first preset signal independently of a voltage level of the second internal voltage and stops the generation of the second preset signal independently of a voltage level of the first internal voltage.

14. The device as claimed in claim 1, wherein the preset signal generation circuit includes first and second preset signal generators, the first preset signal generator operates on the external power supply voltage, generates the first preset signal in response to power-on of the external power supply voltage to the device, and stops the generation of the first preset signal in response to a basic reference voltage that is relative to the external power supply voltage, and a second preset signal generator operates on the external power supply voltage, generates the second preset signal in response to power-on of the external power supply voltage to the device, and stops the generation of the second preset signal in response to the basic reference voltage.

15. The device as claimed in claim 14, further comprising a reference voltage generator generating first and second reference voltages in response to the external power supply voltage, wherein the basic, the first, and the second reference voltages are different in voltage level from each other, the first preset signal generator stops the generation of the first preset signal in response to the basic and the first reference voltage, and the second preset signal generator stops the generation of the second preset signal in response to the basic and the second reference voltage.

16. The device as claimed in claim 1, wherein the first internal voltage is smaller in an absolute value than the second internal voltage.

17. A device, comprising:
a preset signal generation circuit responding to a power-on of an external power supply voltage to the device and generating, independently of the first internal voltage, first, and second preset signals, and stopping generation of the first preset signal when the external power supply voltage reaches a first voltage level and stopping generation of the second preset signal when the external power supply voltage reaches a second voltage level different from the first voltage level;
a first internal voltage generation circuit generating a first internal voltage in response to the external power supply voltage, the first internal voltage generation circuit including first and second voltage generators that respectively perform first and second operations to generate the first internal voltage in response to the power-on of an external power supply voltage to the device, the first voltage generator stopping the first operation in response to stopping the generation of the first preset signal; and
a second internal voltage generation circuit generating a second internal voltage in response to the external power supply voltage, the second internal voltage being different in voltage level from the first internal voltage, the second internal voltage generation circuit including a third voltage generator that stops a third operation to generate the second internal voltage during a period of time when the second preset signal is produced, and the third voltage generator performing the third operation in response to stopping the generation of the second preset signal.

18. The device as claimed in claim 17, wherein the second voltage generator of the first internal voltage generation circuit keeps performing the first operation after stopping the generation of the first preset signal.

19. The device as claimed in claim 17, wherein the second voltage generator of the first internal voltage generation circuit includes a step-down circuit, and the third voltage generator of the second voltage generation circuit includes a bootstrap circuit.

20. The device as claimed in claim 18, wherein the first voltage generator of the first internal voltage generation circuit includes a transistor coupled between a power supply node of the first internal voltage generation circuit receiving the external power supply voltage and an output node of the first internal voltage generator.

* * * * *